US012698422B2

(12) United States Patent　　　　　(10) Patent No.: US 12,698,422 B2
Huang et al.　　　　　　　　　　　　 (45) Date of Patent: Aug. 4, 2026

(54) ELECTRICALLY CONDUCTIVE MASKING TAPE

(71) Applicant: 3M INNOVATIVE PROPERTIES COMPANY, St. Paul, MN (US)

(72) Inventors: Jie Huang, Shanghai (CN); Jing Fang, Shanghai (CN); Jeffrey W. McCutcheon, Baldwin, WI (US); Su Zhang, Shanghai (CN); Dong Yang, Shanghai (CN)

(73) Assignee: 3M Innovative Properties Company, St. Paul, MN (US)

( * ) Notice: Subject to any disclaimer, the term of this patent is extended or adjusted under 35 U.S.C. 154(b) by 950 days.

(21) Appl. No.: 17/784,786

(22) PCT Filed: Dec. 15, 2020

(86) PCT No.: PCT/IB2020/061981

§ 371 (c)(1),
(2) Date: Jun. 13, 2022

(87) PCT Pub. No.: WO2021/124115

PCT Pub. Date: Jun. 24, 2021

(65) Prior Publication Data

US 2023/0002646 A1　　Jan. 5, 2023

(30) Foreign Application Priority Data

Dec. 20, 2019　(CN) ......................... 201911333416.4

(51) Int. Cl.
*C09J 7/38*　　　　(2018.01)
*B32B 1/00*　　　　(2006.01)
(Continued)

(52) U.S. Cl.
CPC .................. *C09J 7/385* (2018.01); *B32B 1/00* (2013.01); *B32B 7/12* (2013.01); *C09J 7/28* (2018.01);
(Continued)

(58) Field of Classification Search
CPC ....... C09J 7/385; C09J 7/28; C09J 9/02; C09J 133/08; C09J 2203/31; C09J 2301/314;
(Continued)

(56) References Cited

U.S. PATENT DOCUMENTS

2009/0163626 A1 *　6/2009　Ukei ......................... C09J 7/385
　　　　　　　　　　　　　　　　　　　　　　 524/99
2015/0284584 A1 *　10/2015　Holguin ............... C09D 133/10
　　　　　　　　　　　　　　　　　　　　　　 524/833
(Continued)

FOREIGN PATENT DOCUMENTS

EP　　　1939263 A1　　8/2012
JP　　　4693210 B2　　6/2011
(Continued)

OTHER PUBLICATIONS

Machine Translation of WO 2016/203510 A1 (Year: 2025).*
(Continued)

*Primary Examiner* — Scott R. Walshon
(74) *Attorney, Agent, or Firm* — Jeffrey M. Olofson

(57)　　　　ABSTRACT

Electrically conductive masking tapes include an electrically conductive backing and an electrically conductive pressure sensitive adhesive layer. The pressure sensitive adhesive contains an acrylate-based copolymeric matrix, a cross-linker, an electrically conductive filler, and at least one antioxidant. The acrylate-based copolymeric matrix is the reaction product of a polymerizable mixture including at least one first alkyl(meth)acrylate monomer with a homopolymer Tg of less than −50° C., and at least one hydroxyl-
(Continued)

functional alkyl(meth)acrylate with a homopolymer Tg of less than −10° C. The electrically conductive tape is capable of being laminated to and cleanly removed from a substrate surface, after being subjected to harsh conditions such as plasma vapor deposition conditions.

18 Claims, 1 Drawing Sheet

(51) Int. Cl.

| | |
|---|---|
| *B32B 7/12* | (2006.01) |
| *C09J 7/28* | (2018.01) |
| *C09J 9/02* | (2006.01) |
| *C09J 133/08* | (2006.01) |
| *C23C 16/02* | (2006.01) |
| *C23C 16/04* | (2006.01) |
| *C23C 16/50* | (2006.01) |
| *C23C 16/56* | (2006.01) |

(52) U.S. Cl.
CPC .............. *C09J 9/02* (2013.01); *C09J 133/08* (2013.01); *C23C 16/0227* (2013.01); *C23C 16/042* (2013.01); *C23C 16/50* (2013.01); *C23C 16/56* (2013.01); *B32B 2307/202* (2013.01); *C09J 2203/31* (2013.01); *C09J 2301/314* (2020.08); *C09J 2301/408* (2020.08); *C09J 2301/414* (2020.08); *C09J 2400/163* (2013.01); *C09J 2433/00* (2013.01)

(58) Field of Classification Search
CPC ............ C09J 2301/408; C09J 2301/414; C09J 2400/163; C09J 2433/00; C09J 133/066; C09J 2400/16; C09J 7/20; C09J 7/40; C09J 7/50; C09J 133/064; C09J 2467/005; B32B 1/00; B32B 7/12; B32B 7/05; B32B 33/00; B32B 2405/00; B32B 2307/202; C23C 16/0227; C23C 16/042; C23C 16/50; C23C 16/56; B05B 12/24; C08F 220/1804; C08F 220/1808; C08K 9/02; C08K 2003/0806; C08K 2003/0862; C08K 2201/001

See application file for complete search history.

(56) References Cited

U.S. PATENT DOCUMENTS

| | | |
|---|---|---|
| 2016/0355703 A1 | 12/2016 | Okawa |
| 2018/0086946 A1* | 3/2018 | Hirao ................ C08F 220/1804 |
| 2019/0359862 A1 | 11/2019 | Fang et al. |

FOREIGN PATENT DOCUMENTS

| | | | |
|---|---|---|---|
| JP | 2014136778 A | * | 7/2014 |
| JP | 2014234444 A | | 12/2014 |
| JP | 6420906 B2 | | 11/2018 |
| WO | 2016203510 A1 | | 12/2016 |
| WO | 2018205127 A1 | | 11/2018 |

OTHER PUBLICATIONS

Machine Translation of JP 2014-136778 A (Year: 2025).*
International Search Report for PCT International Application No. PCT/IB2020/061981, mailed on Feb. 19, 2021, 4 pages.

* cited by examiner

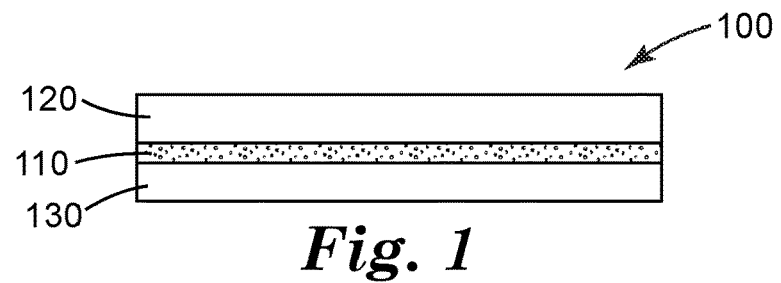
*Fig. 1*
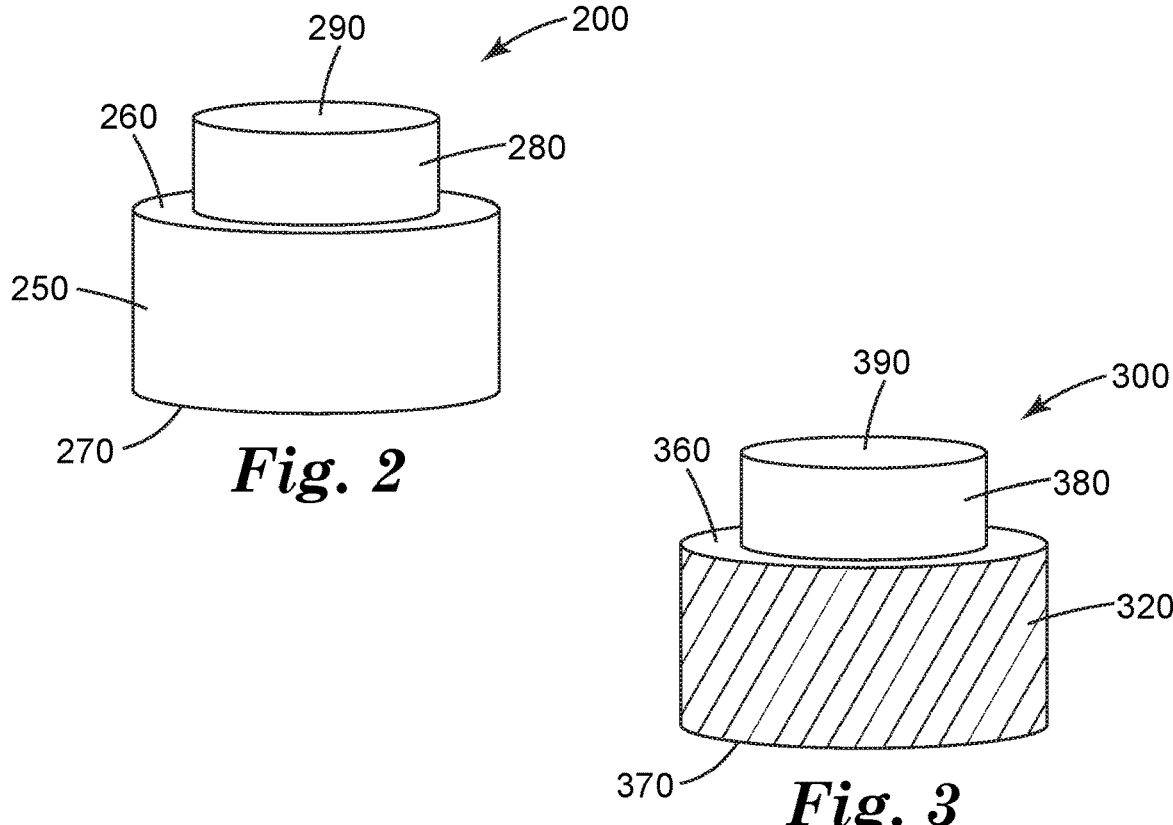
*Fig. 2*
*Fig. 3*
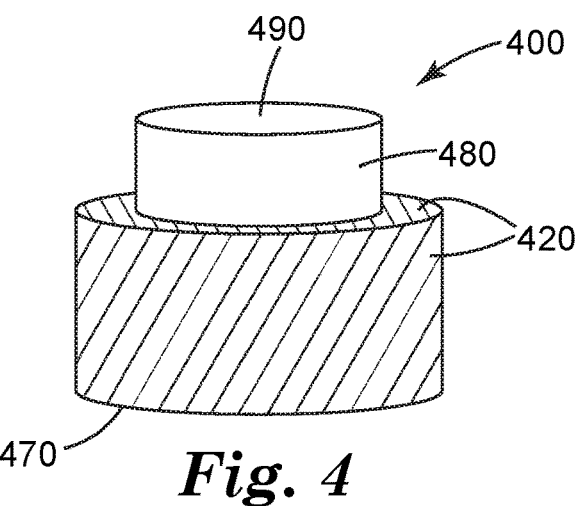
*Fig. 4*

ELECTRICALLY CONDUCTIVE MASKING TAPE

FIELD OF THE DISCLOSURE

The disclosure relates to electrically conductive masking tapes and methods of using the electrically conductive masking tapes to prepare electronic articles.

BACKGROUND

Adhesives have been used for a variety of marking, holding, protecting, sealing and masking purposes. Adhesives are frequently supplied as tapes that generally comprise a backing, or substrate, and an adhesive. Adhesive tapes that are used in the manufacture of articles to protect or temporarily hold in place components of the article during processing are sometimes called processing tapes. Processing tapes are not retained in the final article but are removed following one or more processing steps. Examples of processing tapes include masking tapes, where the masking tape is applied to a surface to cover it and protect it during a process, such as painting, and the masking tape is removed after the painting process to give a surface with adjacent areas that are painted and unpainted.

SUMMARY

The disclosure relates to electrically conductive masking tapes and methods of using the electrically conductive masking tapes to prepare electronic articles. In some embodiments, the electrically conductive tape comprises an electrically conductive backing with a first major surface and a second major surface, and an electrically conductive pressure sensitive adhesive layer with a first major surface and a second major surface, where the second major surface of the pressure sensitive adhesive layer is in contact with the first major surface of the electrically conductive backing. The pressure sensitive adhesive comprises an acrylate-based copolymeric matrix, a crosslinker, an electrically conductive filler, and at least one antioxidant. The acrylate-based copolymeric matrix comprises the reaction product of a polymerizable mixture comprising at least one first (meth) acrylate monomer comprising an alkyl(meth)acrylate with a homopolymer Tg of less than −50° C., and at least one second (meth)acrylate monomer comprising a hydroxyl-functional alkyl(meth)acrylate with a homopolymer Tg of less than −10° C. The electrically conductive tape is capable of being laminated to and cleanly removed from a substrate surface, after being subjected to at least one of the conditions comprising exposure to a basic cleaning solution at a temperature of from 50-90° C. for at least 30 minutes, and subject to plasma vapor deposition conditions including exposure to temperatures of up to 200° C. for up 24 hours.

The conductive tape maintains conductivity between the electrically conductive backing and the substrate to which it is applied through the electrically conductive pressure sensitive adhesive layer through-out the processing steps. The electrically conductive backing functions to protect the substrate during processing. The electrically conductive pressure sensitive adhesive ensures that the electrically conductive backing is grounded to the substrate when processed. This helps to ensure that the substrate does not experience poor results related to the electrically conductive backing not being grounded. The electrically conductive pressure sensitive adhesive not only ensures the electrically conductive tape's grounding performance, but also resists the harsh processing environment, and providing clean removal from the substrate surface after processing. For example, the electrically conductive backing needs to be grounded during plasma vapor deposition processing or the vapor deposition material being deposited onto the substrate near the tape will experience non-uniform application results (thickness, appearance, uniformity, etc).

Also disclosed are methods of preparing articles. In some embodiments, the method comprises providing a substrate with a surface to which plasma vapor deposition is to be carried out, providing an electrically conductive tape article as described above, cleaning the masked surface with a basic solution comprising application of a basic cleaning solution with a pH of 13-14 at a temperature of 50-100° for 30-60 minutes, exposing the masked surface to plasma vapor deposition comprising exposure of the surface to a temperature of 100-200° C. for from 2-24 hours, and cleanly removing the electrically conductive tape article from the substrate surface.

Also disclosed are laminated articles. In some embodiments, the laminated article comprises a three-dimensional substrate with at least a first major surface, a second major surface, and a third major surface that define a volume at least partially comprising substrate material, and an electrically conductive tape as described above, where the first major surface of the pressure sensitive adhesive layer is in contact with at least a portion of the first major surface and optionally the second major surface of the substrate to envelope a portion of the volume of the substrate.

BRIEF DESCRIPTION OF THE DRAWINGS

The present application may be more completely understood in consideration of the following detailed description of various embodiments of the disclosure in connection with the accompanying drawings.

FIG. 1 shows a cross sectional view of an embodiment of an electrically conductive tape article of this disclosure.

FIG. 2 shows a cross sectional view of an article to be masked to form a laminate article of this disclosure.

FIG. 3 shows a cross sectional view of a laminate article of this disclosure.

FIG. 4 shows a cross sectional view of another laminate article of this disclosure.

In the following description of the illustrated embodiments, reference is made to the accompanying drawings, in which is shown by way of illustration, various embodiments in which the disclosure may be practiced. It is to be understood that the embodiments may be utilized and structural changes may be made without departing from the scope of the present disclosure. The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Adhesives have been used for a variety of marking, holding, protecting, sealing and masking purposes. Adhesives are frequently supplied as tapes generally comprise a backing, or substrate, and an adhesive. Adhesive tapes that are used in the manufacture of articles to protect or temporarily hold in place components of the article during processing are sometimes called processing tapes. Processing tapes are not retained in the final article but are removed following one or more processing steps. In some instances, processing tapes are subjected to extreme conditions such as high temperatures, high pressures, exposure to chemicals such as solvents, abrasives, etching materials, and the like and yet are expected to remain adhered during the processing steps without flowing, dripping or slipping and also to be removable after the processing steps are completed. Examples of processing tapes include masking tapes, where the masking tape is applied to a surface to cover it and protect it from a process, such as being painted, the paint is applied, and the masking tape is removed to give a surface with adjacent areas that are painted and unpainted.

One of the processes that can require masking is Physical Vapor Deposition (PVD). PVD Coating refers to a variety of thin film deposition techniques where a solid material is vaporized in a vacuum environment and deposited on substrates as a pure material or alloy composition coating.

As the process transfers the coating material as a single atom or on the molecular level, it can provide extremely pure and high-performance coatings which for many applications can be preferable to other methods used. At the heart of every microchip, and semiconductor device, durable protective film, optical lens, solar panel and many medical devices, PVD Coatings provide crucial performance attributes for the final product. It is used in a wide variety of industries like optical applications ranging from eye glasses to self-cleaning tinted windows, photovoltaic applications for solar energy, device applications like computer chips, displays and communications as well as functional or decorative finishes, from durable hard protective films to brilliant gold, platinum or chrome plating.

The two most common Physical Vapor Deposition Coating processes are Sputtering and Thermal Evaporation. Sputtering involves the bombardment of the coating material known as the target with a high energy electrical charge causing it to "sputter" off atoms or molecules that are deposited on a substrate like a silicon wafer or solar panel. Thermal Evaporation involves elevating a coating material to the boiling point in a high vacuum environment causing a vapor stream to rise in the vacuum chamber and then condense on the substrate.

Because of the high energy conditions of the PVD process, masking is frequently carried out by physically attaching a masking tool to the surface or by forming a mask on the substrate surface by a coating and curing method. Metal tool masking designs are used as they are longer lasting in PVD processing and also need to be grounded to ensure they do not impact the PVD processing. Each of these methods has drawbacks. Physical attachment can be a ponderous and slow method of masking a surface, and the coating and curing method requires removal of the mask, which can be difficult and time consuming. As manufacturers of articles desire quicker processes with fewer steps, these methods of masking are becoming less and less desirable. Therefore, a quicker and easier method of masking substrate surfaces for high energy processes such as PVD is needed.

In this disclosure, electrically conductive masking tapes are described that have the desirable combination of properties of adhering to substrate surfaces, remaining adhered even during the harsh conditions required for PVD processes, providing for the tape to be grounded to the substrate during processing to minimize negative impacts of the tape in the PVD processing, and yet are cleanly removable upon completion of the PVD process. By cleanly removable it is meant that essentially no residue from the tape is left on the substrate surface upon removal. This is an important feature because if residue is left behind, a cleaning step is required to remove it. Residue from the tape can result from a variety of sources. Among the sources of residue: are adhesive flow during the PVD process; adhesion build during the PVD process such that the tape is not easily removed; or degradation of the adhesive polymer causing degradation products to be left on the substrate surface upon removal of the tape.

The electrically conductive masking tapes of this disclosure therefore have the properties of adhering strongly to the substrate surface, the adhesive layer of tape does not flow during processing, and yet the adhesion does not build to such an extent that the tape is not cleanly removable from the substrate surface. Additionally, the tape is able to mask substrates that have three-dimensional surfaces. In this disclosure, three-dimensional surfaces refer to surfaces that are not entirely flat but contains elements that protrude from the substrate surface. The tape is able to envelope these three-dimensional surfaces such that the three-dimensional features of the substrate surface are covered and protected by the tape. The tape is also designed to provide a sharp, clean masking line so that upon removal, the finished PVD processing has left a sharp, clean, defect-free edge to the desired specification limits on the substrate surface. PVD edges can be inspected at various magnification levels to ensure compliance to desired appearance requirement. The resultant masked edge can be inspected at 1×, 2×, 5×, 10×, 100× magnification based on application needs.

The electrically conductive masking tapes comprise an electrically conductive backing and a pressure sensitive adhesive layer, where the pressure sensitive adhesive layer comprises a (meth)acrylate-based matrix, a crosslinking agent, an electrically conductive filler, and an antioxidant. The electrically conductive masking tape is capable of adhering to a substrate surface, grounding the electrically conductive backing of the tape to the substrate via the electrically conductive pressure sensitive adhesive layer, and is cleanly removable after exposure to a basic cleaning solution, the elevated temperature conditions of PVD processes, or a combination thereof.

Laminate articles that include a substrate with an electrically conductive masking tape disposed on at least a portion of the surface of substrate are also disclosed. The substrate surface may have three-dimensional features protruding from the surface, where the electrically conductive masking tape envelopes the surface and the three-dimensional features.

Also disclosed are methods of preparing articles that comprise applying the electrically conductive masking tape to a surface, exposing the surface to PVD process conditions, and cleanly removing the masking tape.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. For example, reference to "a layer" encompasses embodiments having one, two or more layers. As used in this specification and the appended claims, the term "or" is generally employed in its sense including "and/or" unless the content clearly dictates otherwise.

The term "adhesive" as used herein refers to polymeric compositions useful to adhere together two adherends. Examples of adhesives are pressure sensitive adhesives.

Pressure sensitive adhesive compositions are well known to those of ordinary skill in the art to possess properties including the following: (1) aggressive and permanent tack, (2) adherence with no more than finger pressure, (3) sufficient ability to hold onto an adherend, and (4) sufficient cohesive strength to be cleanly removable from the adherend. Materials that have been found to function well as pressure sensitive adhesives are polymers designed and formulated to exhibit the requisite viscoelastic properties resulting in a desired balance of tack, peel adhesion, and shear holding power. Obtaining the proper balance of properties is not a simple process.

The term "(meth)acrylate" refers to monomeric acrylic or methacrylic esters of alcohols. Acrylate and methacrylate monomers or oligomers are referred to collectively herein as "(meth)acrylates". The term "(meth)acrylate-based" when used to describe polymers, refers to polymers that are prepared from (meth)acrylate monomers or reactive materials that contain (meth)acrylate functionality such as (meth) acrylate oligomers. These polymers may contain only (meth)acrylate monomers or they contain monomers that are co-reactive with (meth)acrylates.

As used herein, the term "conductivity" means a measure of the ability of electrical charge to move within and/or through a material.

As used herein, the term "polymer" refers to a polymeric material that is a homopolymer or a copolymer. As used herein, the term "homopolymer" refers to a polymeric material that is the reaction product of one monomer. As used herein, the term "copolymer" refers to a polymeric material that is the reaction product of at least two different monomers.

The term "alkyl" refers to a monovalent group that is a radical of an alkane, which is a saturated hydrocarbon. The alkyl can be linear, branched, cyclic, or combinations thereof and typically has 1 to 20 carbon atoms. In some embodiments, the alkyl group contains 1 to 18, 1 to 12, 1 to 10, 1 to 8, 1 to 6, or 1 to 4 carbon atoms. Examples of alkyl groups include, but are not limited to, methyl, ethyl, n-propyl, isopropyl, n-butyl, isobutyl, tert-butyl, n-pentyl, n-hexyl, cyclohexyl, n-heptyl, n-octyl, and ethylhexyl.

The terms "room temperature" and "ambient temperature" are used interchangeably and refer to a temperature of from 20-25° C.

The terms "weight %", % by weight", "mass %", and "% by mass" are used interchangeably and when referring to components of curable compositions refer to percentage of that component by weight relative to 100% of the weight of the entire curable composition.

The terms "Tg" and "glass transition temperature" are used interchangeably and refer to the glass transition temperature of a polymeric composition. Unless otherwise specified, the glass transition temperature, if measured, is measured by DSC (Differential Scanning calorimetry) using well understood techniques (typically with a heating time of 10° C. per minute). More typically the Tg is calculated using the well-known and understood Fox equation with monomer Tg values provided by the monomer supplier, as is well understood by one of skill in the polymer arts.

Disclosed herein are electrically conductive tapes, especially electrically conductive masking tapes that comprise an electrically conductive backing with a first major surface and a second major surface; and an electrically conductive pressure sensitive adhesive layer with a first major surface and a second major surface, wherein the second major surface of the pressure sensitive adhesive layer is in contact with the first major surface of the electrically conductive backing. The electrically conductive tape is capable of being laminated to and cleanly removed from a substrate surface, after being subjected to rigorous processing conditions. In some embodiments, the rigorous processing conditions comprise at least one of the conditions comprising exposure to a basic cleaning solution at a temperature of from 50-90° C. for at least 30 minutes, and subject to plasma vapor deposition conditions including exposure to temperatures of up to 200° C. for up 24 hours.

A wide array of electrically conductive backings is suitable for use in the electrically conductive tapes of this disclosure. The selection of the electrically conductive backing can depend upon a number of factors such as the desired use for the electrically conductive tape. Examples of suitable electrically conductive backings include foils such as copper foil and aluminum foil, and metallized polymeric films. Examples of metallized polymeric films include polymeric films such as polyimide films with a metal coating that can include a single metal layer or multiple metal layers. The metal layer or layers can be metal atoms or metal alloys, and be coated on the polymeric film by, for example, sputtering, plating or other meal evaporation and deposition techniques.

The electrically conductive pressure sensitive adhesive comprises an acrylate-based copolymeric matrix, an electrically conductive filler; and at least one antioxidant. The matrix comprises the reaction product of a polymerizable mixture comprising at least one first (meth)acrylate monomer comprising an alkyl(meth)acrylate with a homopolymer Tg of less than −50° C., and at least one second (meth) acrylate monomer comprising a hydroxyl-functional alkyl (meth)acrylate with a homopolymer Tg of less than −10° C., and a crosslinker.

Typically, the matrix is formed by free radical polymerization of the (meth)acrylate monomers and crosslinking through the use of a hydroxyl-reactive crosslinker. A variety of (meth)acrylate monomers and hydroxyl-reactive crosslinkers are suitable as described below.

A wide range of first (meth)acrylate monomers are suitable. Examples of suitable first monomers are alkyl (meth) acrylates and alkoxy-substituted alkyl (meth)acrylates. Examples of suitable first monomers include butyl acrylate, 2-ethylhexyl acrylate, iso-octyl acrylate, stearyl methacrylate, 2-methoxyethyl acrylate, ethoxyethoxy ethyl acrylate, and combinations thereof.

A wide array of hydroxyl-functional second (meth)acrylate monomers are suitable. Examples of suitable monomers include 2-hydroxybutyl acrylate and 2-hydroxyethyl acrylate.

In some embodiments, the free radically polymerizable components of polymerizable mixture comprises 85-95% by weight of the first monomer and 5-15% by weight of the second monomer based upon 100% weight of the free radically polymerizable components.

The reaction mixture further comprises a crosslinker. As mentioned above, typically, the crosslinker comprises a hydroxyl-reactive crosslinker. Examples of such crosslinkers include multifunctional aziridine, isocyanate, and epoxy compounds. Examples of aziridine-type crosslinkers include, for example 1,4-bis(ethyleneiminocarbonylamino) benzene, 4,4'-bis(ethyleneiminocarbonylamino)diphenylmethane, 1,8-bis(ethyleneiminocarbonylamino)octane, and 1,1'-(1,3-phenylene dicarbonyl)-bis-(2-methylaziridine).

The aziridine crosslinker 1,1'-(1,3-phenylene dicarbonyl)-bis-(2-methylaziridine) (CAS No. 7652-64-4), commonly referred to as "Bisamide" is particularly useful. Common polyfunctional isocyanate crosslinkers include, for example, trimethylolpropane toluene diisocyanate, tolylene diisocyanate, and hexamethylene diisocyanate. In some embodiments, the crosslinker comprises 0.04-0.90% by weight of the total solids content of the pressure sensitive adhesive layer.

The electrically conductive pressure sensitive adhesive layer also comprises at least one electrically conductive filler. The level of electrically conductive filler can vary widely, typically the pressure sensitive adhesive layer comprises 5-19% by weight of the total solids content of the pressure sensitive adhesive layer. A wide array of conductive fillers is suitable, and a broad range of weight percent fillers are useful based on the end product being masked with the conductive masking tape. Conductive fillers typically range from 0.5 to 50 weight %, more typically 1-30% %, or even 5-19 weight %. Examples of suitable electrically conductive fillers include nickel powder, silver powder, and nickel-coated graphite particles such as those described in U.S. Ser. No. 16/239,122 filed on Jan. 3, 2019.

The electrically conductive pressure sensitive adhesive layer also comprises at least one anti-oxidant. A wide range of anti-oxidants are suitable. Useful antioxidants include but are not limited to tetrakis[methylene 3-(3',5'-di-tert-butyl-4'-hydroxyphenyl)propianate]methane, available as IRGANOX 1010, tris(2,4-di butylphenyl)phosphite available as IRGAFOS 168, dialkyl thiodipropionate available as IRGAFOS P800 from BASF, and hindered amines available as TINUVIN 622.

The electrically conductive tape may further comprise a release liner in contact with the first major surface of the electrically conductive pressure sensitive adhesive layer. The release liner is present to protect the pressure sensitive adhesive layer until the tape is to be used. Exemplary release liners include those prepared from paper (e.g., Kraft paper) or polymeric material (e.g., polyolefins such as polyethylene or polypropylene, ethylene vinyl acetate, polyurethanes, polyesters such as polyethylene terephthalate, and the like, and combinations thereof). At least some release liners are coated with a layer of a release agent such as a silicone, a fluorosilicone-containing material or a fluorocarbon-containing material.

The electrically conductive tape has the desirable properties of adhering strongly to a surface to be masked and being removable after one or more processing steps are carried out. One way of characterizing adhesive properties is by measuring 180° Peel Adhesion to a standard substrate such as a stainless-steel substrate, before and after exposing the adhered tape to the conditions of the processing steps. It should be understood that 180° Peel Adhesion to a stainless-steel substrate is a method of characterizing the properties of the tape, and it does not mean that the tape is only suitable for use on stainless steel. In this way, by using a standardized testing procedure, one is able to characterize the properties of the tape. In some embodiments, the initial 180° Peel Adhesion to a stainless-steel substrate is in the range 0.1-0.3 Newtons/millimeter. In some of these embodiments, the aged 180° Peel Adhesion to a stainless-steel substrate is in the range 0.3-0.5 Newtons/millimeter, wherein aging comprises exposure to a basic cleaning solution at a temperature of from 50-90° C. for at least 30 minutes; and exposure to temperatures of up to 200° C. for up 24 hours Also disclosed herein are laminated articles. The laminated articles comprise a three-dimensional substrate with at least a first major surface, a second major surface, and a third major surface that define a volume at least partially comprising substrate material, and an electrically conductive tape. The electrically conductive tape has been described above and comprises an electrically conductive backing with a first major surface and a second major surface, and an electrically conductive pressure sensitive adhesive layer with a first major surface and a second major surface. The second major surface of the pressure sensitive adhesive layer is in contact with the first major surface of the electrically conductive backing. The pressure sensitive adhesive comprises an acrylate-based copolymeric matrix, the matrix comprising the reaction product of a reaction mixture comprising: at least one first (meth)acrylate monomer comprising alkyl(meth)acrylate with a homopolymer Tg of less than −50° C.; and at least one second (meth)acrylate monomer comprising a hydroxyl-functional alkyl(meth)acrylate with a homopolymer Tg of less than −10° C.; a crosslinker; an electrically conductive filler; and at least one antioxidant. The first major surface of the pressure sensitive adhesive layer is in contact with at least a portion of the first major surface and optionally the second major surface of the substrate to envelope a portion of the volume of the substrate.

In some embodiments, the first major surface comprises a curved surface. In some embodiments, the electrically conductive tape envelopes at least 5% of the entire three-dimensional volume of the three-dimensional substrate.

In some embodiments, the substrate further comprises at least one additional feature, where the additional feature is a three-dimensional feature with at least a fourth major and a fifth major surface.

Also disclosed are methods of preparing articles. In some embodiments, the method comprises providing a substrate with a surface to which plasma vapor deposition is to be carried out, providing an electrically conductive tape article with a first major surface and a second major surface as described above, contacting the first major surface of the electrically conductive tape article to a portion of the substrate surface to provide a masked surface, cleaning the masked surface with a basic solution, exposing the masked surface to plasma vapor deposition, and cleanly removing the electrically conductive tape article from the substrate surface.

In some embodiments, the cleaning of the masked surface with a basic solution comprises application of a basic cleaning solution with a pH of 13-14 at a temperature of 50-100° for 30-60 minutes.

In some embodiments, exposing the masked surface to plasma vapor deposition comprises exposure of the surface to a temperature of 100-200° C. for from 2-24 hours.

The current disclosure may be further understood by reference to the Figures. FIG. 1 shows a cross-sectional view of electrically conductive tape 100. Electrically conductive tape 100 comprises electrically conductive adhesive layer 110, electrically conductive backing 120, and release liner 130.

FIG. 2 shows a perspective view of three-dimensional article 200 to be masked. Article 200 comprises first major surface 250, second major surface 260, third major surface 270, fourth major surface 280, and fifth major surface 290. Fourth major surface 280 and fifth major surface 290 form a secondary three-dimensional structure.

FIG. 3 shows a perspective view of masked three-dimensional article. Article 300 comprises first major surface 350 (not shown) that is masked by an electrically conductive tape with exposed electrically conductive backing 320, second major surface 360 (which can optionally be masked by an overlap of the electrically conductive tape), third major surface 370, fourth major surface 380, and fifth major surface 390. Fourth major surface 380 and fifth major surface 390 form a secondary three-dimensional structure.

FIG. 4 shows a perspective view of masked three-dimensional article. Article 400 comprises first major surface 450 (not shown) that is masked by a electrically conductive tape with exposed electrically conductive backing 420, second major surface 460 (not shown) which is also masked by the electrically conductive tape with exposed electrically conductive backing 420, third major surface 470, fourth major surface 480, and fifth major surface 490. Fourth major surface 480 and fifth major surface 490 form a secondary three-dimensional structure.

Examples

Objects and advantages of this disclosure are further illustrated by the following comparative and illustrative examples. Unless otherwise noted, all parts, percentages, ratios, etc. in the examples and the rest of the specification are by weight, and all reagents used in the examples were obtained, or are available, from general chemical suppliers such as, for example, Sigma-Aldrich Corp., Saint Louis, MO, US or may be synthesized by conventional methods.

The following abbreviations are used herein: min=minutes, hr=hours, kg=kilograms, μm=micrometers $(10^{-6}$ m), mm=millimeters, ° C.=degrees Celsius, N=Newtons=kg-m/sec$^2$.

Sample Preparation Procedures

TABLE 1

| Materials | | |
|---|---|---|
| Name | Description | Supplier |
| Azodiisobutyl nitrile | Initiator | DuPont, Midland, MI, US |
| Isopropanol (IPA) | Chain transfer agent | Xiangshun, China. |
| 2-EHA | 2-Ethyl Hexyl Acrylate: $T_g$ of homopolymer = −52° C. | HuaYi, Shanghai, China |
| BA | Butyl Acrylate: $T_g$ of homopolymer = −53° C. | HuaYi, Shanghai, China |
| MA | Methyl Acrylate: $T_g$ of homopolymer = 10° C. | HuaYi, Shanghai, China |
| AA | Acrylic Acid: $T_g$ of homopolymer = 100° C. | BASF, Ludwigshafen, Germany |
| 2-HEA | 2-Hydroxyethyl Acrylate: $T_g$ of homopolymer = −14° C. | JinYan, Taixing, China |
| SD1000 | Nickel Powder Conductive Filler | Wuxi Shunda Inc., Jiangsu, China |
| Bisamide | Crosslinker | CAS No. 7652-64-4 |
| DESMODUR L-75 | Aromatic polyisocyanate Crosslinker | Covestro, Leverkusen, Germany |
| IRGANOX 1010 | Antioxidant | BASF, Ludwigshafen, Germany |

TABLE 1-continued

| Materials | | |
|---|---|---|
| Name | Description | Supplier |
| IRGAFOS 168 | Antioxidant | BASF, Ludwigshafen, Germany |
| Ethyl acetate | Solvent | SOPO, Jiangsu, China |
| PET liner 50# | PET liner 18 g/inch | HQ E-material Co.Ltd, Guangdong, China |
| Copper foil | ED copper foil 12# | Wuhu Maitong Metal Co.Ltd, Anhui, China |

Preparation of Acrylate-Based Random Copolymer Solutions 100 parts by weight of monomers in the amounts shown in Table 2 were added to a glass bottle, then the appropriate amounts of ethyl acetate solvent were added to achieve the target weight percentage of solid materials. Then suitable amounts of azodiisobutyl nitrile as initiator and isopropanol (IPA) as chain transfer agent were added. The mixture was purged with nitrogen gas for at least 2 min to remove oxygen and tightly sealed. The bottle was placed in a LAUNDER-OMETER machine (available from SDL Atlas, Nanshan, China) for 24 hours at 60-70° C. for polymerization of the mixture, to obtain an acrylic random copolymer solution.

TABLE 2

| Composition of acrylate-based copolymer solutions | | | | | | |
|---|---|---|---|---|---|---|
| | Monomer Amount (Parts by Weight) | | | | | |
| | 2-EHA | BA | MA | AA | 2-HEA | % Solids |
| Copolymer A | 85 | | 5 | | 10 | 40.0 |
| Copolymer B | | 90 | | | 10 | 40.0 |
| Copolymer C | 90 | | | 10 | | 30.0 |

Preparation of Tapes:

Components in the amounts shown in Tables 3 and 4 were mixed to prepare adhesive solutions. All adhesive solutions in Tables 3 and 4 had a solids content of 25% by weight. The adhesive solutions were then coated onto a 50 μm thick PET liner. The samples from Table 3 were dried at 70° C. for 10 min, after which the thickness was measured. The tapes of Table 4 were dried in a series of ovens having temperatures of 40° C., 80° C., 100° C., 120° C., respectively, at a line speed of 2 m/min. The adhesives were then covered with 12 μm thick Cu foil. All of the samples were kept at room temperature for one week to achieve a suitable degree of crosslinking.

TABLE 3

| | | IRGANOX 1010 | IRGAFOS 168 | | | Thickness (µm) |
|---|---|---|---|---|---|---|
| Ex. | Copolymer C | | | SD1000 | RD-1054 | |
| CE1 | 88.89 | 1.00 | 0.33 | 11.11 | 0.045 | 20 |
| CE2 | 88.89 | 1.00 | 0.33 | 11.11 | 0.060 | 20 |
| CE3 | 88.89 | 1.00 | 0.33 | 11.11 | 0.045 | 30 |
| CE4 | 88.89 | 1.00 | 0.33 | 11.11 | 0.060 | 30 |
| | | IRGANOX 1010 | IRGAFOS 168 | | | Thickness (µm) |
| Ex. | Copolymer A | | | SD1000 | L-75 | |
| 1 | 88.89 | 1.00 | 0.33 | 11.11 | 0.20 | 20 |
| 2 | 88.89 | 1.00 | 0.33 | 11.11 | 0.30 | 20 |
| | | IRGANOX 1010 | IRGAFOS 168 | | | Thickness (µm) |
| Ex. | Copolymer B | | | SD1000 | L-75 | |
| 3 | 88.89 | 1.00 | 0.33 | 11.11 | 0.30 | 20 |
| 4 | 88.89 | 1.00 | 0.33 | 11.11 | 0.40 | 20 |
| 5 | 88.89 | 1.00 | 0.33 | 11.11 | 0.60 | 20 |
| 6 | 88.89 | 1.00 | 0.33 | 11.11 | 0.80 | 20 |
| CE5 | 80.00 | 1.00 | 0.33 | 20.00 | 0.80 | 20 |
| CE6 | 75.00 | 1.00 | 0.33 | 25.00 | 0.80 | 20 |

*all amounts provided in percentage by weight

TABLE 4

Composition of exemplary conductive tapes*

| Ex. | Copolymer B | IRGANOX 1010 | IRGAFOS 168 | SD1000 | L-75 | Thickness (µm) |
|---|---|---|---|---|---|---|
| 7 | 88.89 | 1.00 | 0.33 | 11.11 | 0.60 | 20 |
| 8 | 88.89 | 1.00 | 0.33 | 11.11 | 0.90 | 20 |
| 9 | 87.00 | 1.00 | 0.33 | 13.00 | 0.90 | 20 |
| 10 | 85.00 | 1.00 | 0.33 | 15.00 | 0.90 | 20 |

*all amounts provided in percentage by weight

Test Methods

Peel test sample preparation: Stainless steel panels were wiped three times with a tissue wetted with isopropanol using heavy hand pressure. The cleaned panels were air dried for 10 min. 25.4 mm×200 mm adhesive tape samples were placed onto the stainless steel panels, and a 1 kg rubber roller was rolled back and forth once on top of the tape to adhere the tape sample to the surface of the stainless steel panel.

Aging conditions: Tape samples were cut into 1 inch (25.4 mm) wide strips, and the strips were then adhered to the surface of stainless steel panels as described above. The test panels were put into an oven at room temperature. The oven was then heated up to 150° C., and the samples were held at 150° C. for 8 hrs.

Cleaning conditions: The 1 inch (25.4 mm) wide tape strips were adhered to the surface of stainless steel panels as described above. A NaOH aqueous solution having a pH of 13-14 was prepared and heated to 85-90° C. The test panels were immersed in the heated base solution for 30 min, then rinsed with water. 180° peel force test (23° C., 60% Relative Humidity): All samples were held at a temperature of 23° C. and a relative humidity of 60% for 20 min prior to peel testing at room temperature. Procedures of the room temperature peel force tests are as described in ASTM International Standard D3330-04(2018), "Standard Test Method for Peel Adhesion of Pressure-Sensitive Tape." Peel strength tests were performed using an INSTRON tensile tester (available from Instron, Norwood, MA, US) at a peeling speed of 304.8 mm/min. For the purposes of these examples, tapes are considered to be "easily removable" when the peel strength is less than 0.6 N/mm.

Removability: Removability of the adhesive was assessed by examining the amount of residue on the stainless steel after testing. The removability rating scale ranged from 0 (large amounts or adhesive left on the surface throughout the adhered area) to 5 (no visible residue remaining on the stainless steel surface). For a removability rating of 4, the residual adhesive on the stainless surface was approximately 0-5% of the total adhered area. For removability ratings of 3, 2 and 1, the residue adhesive on the stainless surface was 5-10%, 10-15% and >15% of the adhered area, respectively.

Conductivity (XY-Axis Electrical Resistance through Adhesive): A strip of the electrically conductive tape (10 mm×50 mm) was placed with adhesive side down between the electrodes on special PCB board. The electrodes are gold plated copper surface (ENIG: Electroless Nickel Immersion Gold plated). The size of PCB board is 50 (X-axis) mm×75 (Y-axis) mm and the thickness is 1.6 mm. The electrode on the board has a 10 mm width. The distance between electrodes is 30 mm. After initial hand lamination to provide for a 10 mm×10 mm contact area between the tape and electrodes, a 2 kg rubber roller was applied across the tape one time. These application methods simulate a typical manufacturing process that might be used to apply the tapes to a surface. After 20 minutes of dwell time, the DC resistance between the electrodes was measured with a micro-ohm meter. The resistance results are recorded after 5-30 seconds as initial resistance.

For the conductivity test method and substrate shown, the preferred range of contact resistance is <2000 mOhms, preferably <700 mOhms and most preferred resistance is <300 mOhms and even <50 mOhms. The conductivity levels and preferred ranges can vary based on surface type and if the surface of the test method noted was changed to different metal. Changes such as replacing the gold plated surface (ENIG) to a 316 stainless steel surface with no additional plating, would cause the conductivity values to shift in a ratio from the values for the current test method substrate, and would involve using an updated test method with the different test substrate: (for example 316 stainless steel, 304 stainless steel, aluminum, titanium, etc versus the currently used ENIG substrate) based on the exact substrate used for a specific application being masked.

Results

Table 5 summarizes the peel test results on samples before and after cleaning in 85-90 C NaOH solution and after aging at 150° C. for 8 hours. Adhesion increases after high temperature cleaning but remains within an easily removable range. In addition, no adhesive residue remained on the surface for any of Examples 7-10.

TABLE 5

| | 180° Peel Force on Stainless Steel after Cleaning in High Temperature Base Solution | |
| Ex. | Without cleaning (N/mm) | After Cleaning in Hot NaOH Solution (N/mm) |
| --- | --- | --- |
| 7 | 0.20 | 0.32 |
| 8 | 0.16 | 0.24 |
| 9 | 0.15 | 0.23 |
| 10 | 0.14 | 0.20 |

Tables 6 summarizes the peel strength and removability rating of samples after aging at 150° C. for 8 hours. The peel force of Comparative Examples CE1-CE4 increased to 1.3-1.4 N/mm after high temperature aging, and significant amounts of residual adhesive remained on the stainless steel substrate after the peel test. Examples 1-10 included Copolymers A and B, which did not contain acrylic acid monomer, and were prepared using various types and levels of crosslinker. The peel strength was reduced to between 0.3 N/mm and 0.4 N/mm, and Examples 1-10 show acceptable removability with low residual adhesive. Comparative Examples CE5 and CE6 contain 20% and 25% electrically conductive nickel powder, respectively, and demonstrate residual adhesive. Examples 9 and 10 contain 13% and 15% electrically conductive nickel powder, respectively, and demonstrate both acceptable peel force and good removability.

TABLE 6

| | 180° Peel Force and Removability Rating after High Temperature Aging | |
| Ex. | Peel Force (N/mm) | Removability Rating |
| --- | --- | --- |
| CE1 | 1.38 | 0 |
| CE2 | 1.33 | 1 |
| CE3 | 1.43 | 0 |
| CE4 | 1.38 | 0 |
| CE5 | 0.30 | 1 |
| CE6 | 0.32 | 0 |
| 1 | 0.52 | 2 |
| 2 | 0.52 | 2 |
| 3 | 0.45 | 3 |

TABLE 6-continued

| | 180° Peel Force and Removability Rating after High Temperature Aging | |
| Ex. | Peel Force (N/mm) | Removability Rating |
| --- | --- | --- |
| 4 | 0.40 | 4 |
| 5 | 0.39 | 5 |
| 6 | 0.34 | 5 |
| 7 | 0.44 | 5 |
| 8 | 0.37 | 5 |
| 9 | 0.32 | 5 |
| 10 | 0.30 | 5 |

Several samples were tested for Electrical Resistance through the adhesive layer using the test method described above. The results are presented in Table 7.

TABLE 7

| | Conductivity of XY-Axis Electrical Resistance through Adhesive |
| Ex. | Resistance (mΩ) |
| --- | --- |
| 5 | <200 |
| 6 | <200 |
| 7 | <200 |
| 8 | <200 |
| 9 | <200 |
| 10 | <200 |

Various modifications and alterations to this disclosure will become apparent to those skilled in the art without departing from the scope and spirit of this disclosure. It should be understood that this disclosure is not intended to be unduly limited by the illustrative embodiments and examples set forth herein and that such examples and embodiments are presented by way of example only with the scope of the disclosure intended to be limited only by the claims set forth herein as follows.

What is claimed is:

1. An electrically conductive tape consisting essentially of:

an electrically conductive backing with a first major surface and a second major surface; and an electrically conductive pressure sensitive adhesive layer with a first major surface and a second major surface, wherein the second major surface of the pressure sensitive adhesive layer is in contact with the first major surface of the electrically conductive backing, wherein the pressure sensitive adhesive consists essentially of:

an acrylate-based copolymeric matrix, the matrix comprising the reaction product of a polymerizable mixture comprising:

85-95% by weight of at least one first (meth)acrylate monomer comprising an alkyl(meth)acrylate with a homopolymer Tg of less than −50° C.; and 5-15% by weight of at least one second (meth) acrylate monomer comprising a hydroxyl-functional alkyl(meth)acrylate with a homopolymer Tg of less than −10° C.;

0.04-0.90% by weight of a crosslinker;

an electrically conductive filler comprising nickel powder, silver powder, or nickel-coated graphite particles; and at least one antioxidant, wherein the electrically conductive tape is capable of being laminated to and cleanly removed from a substrate surface, after being subjected to at least one of the conditions comprising:

exposure to a basic cleaning solution at a temperature of from 50-90° C. for at least 30 minutes; and subject to plasma vapor deposition conditions including exposure to temperatures of up to 200° C. for up to 24 hours.

2. The electrically conductive tape of claim 1, wherein the electrically conductive backing comprises copper foil, aluminum foil, or a metallized polymeric film.

3. The electrically conductive tape of claim 1, wherein the first monomer comprises butyl acrylate, 2-ethylhexyl acrylate, iso-octyl acrylate, stearyl methacrylate, 2-methoxyethyl acrylate, ethoxyethoxy ethyl acrylate, and combinations thereof.

4. The electrically conductive tape of claim 1, wherein the second monomer comprises 2-hydroxybutyl acrylate, or 2-hydroxyethyl acrylate.

5. The electrically conductive tape of claim 1, wherein the crosslinker comprises a hydroxyl-reactive crosslinker.

6. The electrically conductive tape of claim 1, wherein the electrically conductive filler comprises 5-19% by weight of the total solids content of the pressure sensitive adhesive layer.

7. The electrically conductive tape of claim 1, further comprising a release liner in contact with the first major surface of the electrically conductive pressure sensitive adhesive layer.

8. The electrically conductive tape of claim 1, wherein the initial 180° Peel Adhesion to a stainless steel substrate is in the range of 0.1-0.3 Newtons/millimeter.

9. The electrically conductive tape of claim 1, wherein the aged 180° Peel Adhesion to a stainless steel substrate is in the range of 0.3-0.5 Newtons/millimeter, wherein aging comprises exposure to a basic cleaning solution at a temperature of from 50-90° C. for at least 30 minutes; and exposure to temperatures of up to 200° C. for up to 24 hours.

10. A method of preparing an article comprising:

providing a substrate with a surface to which plasma vapor deposition is to be carried out;

providing an electrically conductive tape article, wherein the electrically conductive tape article consists essentially of:

an electrically conductive backing with a first major surface and a second major surface; and an electrically conductive pressure sensitive adhesive layer with a first major surface and a second major surface, wherein the second major surface of the pressure sensitive adhesive layer is in contact with the first major surface of the electrically conductive backing, wherein the pressure sensitive adhesive consists essentially of:

an acrylate-based copolymeric matrix, the matrix comprising the reaction product of a reaction mixture comprising:

85-95% by weight of at least one first (meth) acrylate monomer comprising an alkyl(meth) acrylate with a homopolymer Tg of less than −50° C.; and 5-15% by weight of at least one second (meth) acrylate monomer comprising a hydroxyl-functional alkyl(meth)acrylate with a homopolymer Tg of less than-10° C.;

0.04-0.90% by weight of a crosslinker;

an electrically conductive filler comprising nickel powder, silver powder, or nickel-coated graphite particles; and at least one antioxidant;

contacting the first major surface of electrically conductive tape article to a portion of the substrate surface to provide a masked surface;

cleaning the masked surface with a basic solution comprising application of a basic cleaning solution with a pH of 13-14 at a temperature of 50-100° for 30-60 minutes;

exposing the masked surface to plasma vapor deposition comprising exposure of the surface to a temperature of 100-200° C. for from 2-24 hours; and cleanly removing the electrically conductive tape article from the substrate surface.

11. The method of claim 10, wherein the electrically conductive backing comprises copper foil, aluminum foil, or a metallized polymeric film.

12. The method of claim 10, wherein the first monomer comprises butyl acrylate, 2-ethylhexyl acrylate, iso-octyl acrylate, stearyl methacrylate, 2-methoxyethyl acrylate, ethoxyethoxy ethyl acrylate, and combinations thereof, and the second monomer comprises 2-hydroxybutyl acrylate, or 2-hydroxyethyl acrylate.

13. The method of claim 10, wherein the crosslinker comprises a hydroxyl-reactive crosslinker.

14. The method of claim 10, wherein the electrically conductive filler comprises 5-19% by weight of the total solids content of the pressure sensitive adhesive layer and comprises nickel powder, silver powder, and nickel-coated graphite particles.

15. A laminated article comprising:

a three-dimensional substrate with at least a first major surface, a second major surface, and a third major surface that define a volume at least partially comprising substrate material; and an electrically conductive tape, the electrically conductive tape consists essentially of:

an electrically conductive backing with a first major surface and a second major surface; and an electrically conductive pressure sensitive adhesive layer with a first major surface and a second major surface, wherein the second major surface of the pressure sensitive adhesive layer is in contact with the first major surface of the electrically conductive backing, wherein the pressure sensitive adhesive consists essentially of:

an acrylate-based copolymeric matrix, the matrix comprising the reaction product of a reaction mixture comprising:

85-95% by weight of at least one first (meth) acrylate monomer comprising an alkyl(meth) acrylate with a homopolymer Tg of less than −50° C.; and 5-15% by weight of at least one second (meth) acrylate monomer comprising a hydroxyl-functional alkyl(meth)acrylate with a homopolymer Tg of less than −10° C.;

0.04-0.90% by weight of a crosslinker;

an electrically conductive filler comprising nickel powder, silver powder, or nickel-coated graphite particles; and at least one antioxidant; wherein the first major surface of the pressure sensitive adhesive layer is in contact with at least a portion of the first major surface and optionally the second major surface of the substrate to envelope a portion of the volume of the substrate.

16. The laminated article of claim 15, wherein first major surface comprises a curved surface.

17. The laminated article of claim 15, wherein the electrically conductive tape envelopes at least 5% of the entire three-dimensional volume of the substrate.

18. The laminated article of claim 15, wherein the substrate further comprises at least one additional feature, wherein the at least one additional feature is a three-dimensional feature with at least a fourth major and a fifth major surface.

* * * * *